United States Patent [19]

Morihara

[11] Patent Number: 5,378,644
[45] Date of Patent: Jan. 3, 1995

[54] METHOD FOR MANUFACTURING A SEMICONDUCTOR DEVICE

[75] Inventor: Toshinori Morihara, Hyogo, Japan
[73] Assignee: Mitsubishi Denki Kabushiki Kaisha, Tokyo, Japan
[21] Appl. No.: 981,682
[22] Filed: Nov. 25, 1992

Related U.S. Application Data

[62] Division of Ser. No. 682,517, Apr. 9, 1991, abandoned.

[30] Foreign Application Priority Data

Apr. 13, 1990 [JP] Japan .................................. 2-98949

[51] Int. Cl.$^6$ ........................................... H01L 21/265
[52] U.S. Cl. ........................................ 437/44; 437/89; 437/913
[58] Field of Search ..................... 437/40, 44, 89, 105, 437/104, 107, 913; 148/DIG. 135

[56] References Cited

U.S. PATENT DOCUMENTS

| | | | |
|---|---|---|---|
| 4,378,627 | 4/1983 | Jambotkar | 156/653 |
| 4,824,799 | 4/1989 | Komatsu | 437/89 |
| 4,923,824 | 5/1990 | Fertig et al. | 437/105 |
| 4,925,810 | 5/1990 | Kano et al. | 437/107 |
| 4,966,861 | 10/1990 | Mieno et al. | 437/974 |
| 4,982,269 | 1/1991 | Calligaro . | |
| 5,067,000 | 11/1991 | Eimori et al. . | |
| 5,079,183 | 1/1992 | Maeda et al. | 437/89 |
| 5,084,419 | 1/1992 | Sakao | 47/85 |
| 5,086,011 | 2/1992 | Shiota | 148/DIG. 135 |

FOREIGN PATENT DOCUMENTS

| | | | |
|---|---|---|---|
| 0126292 | 11/1984 | European Pat. Off. | 437/89 |
| 3930016 | 4/1990 | Germany . | |
| 57-68049 | 4/1982 | Japan | 437/89 |
| 63-224218 | 9/1988 | Japan | 437/89 |
| 0133920 | 2/1989 | Japan | 437/89 |
| 21169 | 1/1994 | Rep. of Korea . | |

OTHER PUBLICATIONS

Ghandhi, "VLSI Fabrication Principles", 1983, pp. 231–235.
IEEE (1987) FIG. 2-43, Silicon Processing for the VLSI Era, vol. 1, pp. 59–60.
Yamada et al., "Spread Source/Drain (SSD) MOSFET Using Selective Silicon Growth for 64Mbit DRAMs", IEEE Journal (1989), pp. 2.4.1–2.4.4.
Kurten et al., "Selective Low-Pressure Silicon Epitaxy for MOS and Bipolar Transistor Application", IEEE Transactions on Electron Devices, vol. ED-30, No. 11 (Nov. 1983), pp. 1511–1515.
Sagao et al., "Application of Selective Silicon Epitaxial Growth for CMOS Technology", IEDN Tech. Dig. (1984), pp. 593–596.
Endo et al., "Scaled CMOS Technology Using SEG Isolation and Buried Well Process", IEEE Transactions on Electron Devices, vol. ED-33, No. 11 (Nov. 1986), pp. 1659–1666.
Fuse et al., "A New Isolation Method with Boron-Implanted Sidewalls for Controlling Narrow-Width Effect", IEEE Transactions on Electron Devices, vol. ED-34, No. 2 (Feb. 1987), pp. 356–359.
VLSI Technology, McGraw-Hill-Verlag, 1988, pp. 79–82; Pimbley et al., "Advanced CMOS Process Technology", VLSI Electronics Microstructure Science, vol. 19.

*Primary Examiner*—Tom Thomas
*Assistant Examiner*—Michael Trinh
*Attorney, Agent, or Firm*—Lowe, Price, LeBlanc & Becker

[57] ABSTRACT

A semiconductor device comprising an element separation insulator layer (5, 6, 29) is formed to surround an active region and insulate this active region from other active regions, and to have substantially uniform height throughout its periphery on a main surface of a semiconductor substrate (1). A semiconductor layer (14) is formed flat on an entire area of the active region surrounded by this element separation insulator layer (5, 6, 29) and essentially coplanar to it. The surface of the semiconductor layer (14) is used as an element formation region. This semiconductor device can remarkably reduce an error or difference between design size of the element pattern and actual size of the element, and also can prevent a short-circuiting between conductive wirings by debris.

12 Claims, 10 Drawing Sheets

FIG. 1C  PRIOR ART
n-TYPE ION

FIG. 1D  PRIOR ART
n-TYPE ION

METHOD FOR MANUFACTURING A SEMICONDUCTOR DEVICE

This application is a divisional application of application Ser. No. 07/682,517, filed Apr. 9, 1991 now abandoned.

BACKGROUND OF THE INVENTION

1. Field of the Invention

The present invention relates to a semiconductor device and a manufacturing method of the same, and particularly to a semiconductor device having an element separation structure for obtaining good element characteristics and a manufacturing method of the semiconductor device for efficiently forming the element separation structure.

2. Description of the Background Art

Due to development of integration of semiconductor devices in recent years, improvements of formation processes of element separation structures have been strongly desired in order to obtain good element characteristics.

The element separation structure of the semiconductor device and the manufacturing method in the prior art will be described below with reference to FIGS. 1A–1D. These figures sequentially illustrate manufacturing processes of a semiconductor device in which transistors having large MOS (Metal Oxide Semiconductor) type LDD (Lightly Doped Drain) structures are formed in active regions in which element separation is effected by field shield parts.

Figure 1A:
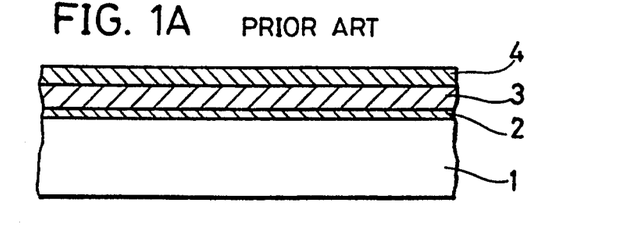
FIGS. 1A, 1B, 1C and 1D are cross sections sequentially illustrating manufacturing processes of a semiconductor device in the prior art.

In this prior art, a SiO$_2$ film 2 of about 200 Å in thickness is initially formed, e.g., by a thermal oxidation method on an entire area of a p-type semiconductor substrate 1 and a polysilicon layer 3 of about 2000 Å in thickness is then formed thereon, e.g., by a vacuum CVD method. A SiO$_2$ film 4 of about 2000 Å in thickness is further deposited on an entire area of the polysilicon layer 3, e.g., by a CVD method (FIG. 1A).

Figure 1B:
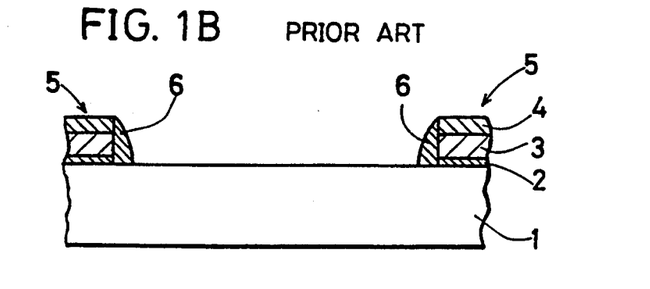

Then, photolithography and etching are utilized to sequentially and selectively etch the SiO$_2$ film 4, the polysilicon layer 3 and the SiO$_2$ film 2 to form a field shield part 5. Thereafter, a SiO$_2$ film of about 2000 Å in thickness is deposited on an entire surface of the semiconductor substrate 1 by the CVD method or the like, and then a sidewall spacer 6 is formed on the sidewall of the field shield part 5 by anisotropic etching. Simultaneously, the surface of the semiconductor substrate 1 except for an area provided with the field shield part 5 is exposed (FIG. 1B).

Figure 1C:
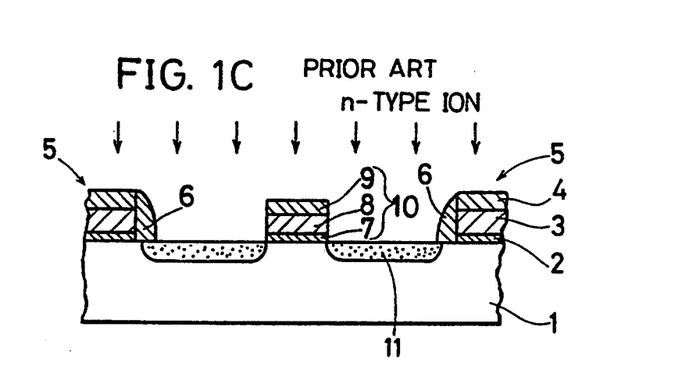

Then, a SiO$_2$ film 7 of about 200 Å in thickness, a polysilicon layer 8 of about 2000 Å in thickness and a SiO$_2$ film 9 of about 2000 Å in thickness are sequentially formed on the entire surface of the semiconductor substrate 1. The photolithography and etching are then used to sequentially etch the SiO$_2$ film 9, the polysilicon layer 8 and the SiO$_2$ film 7 to form a gate part 10. Then, an n-type impurity ion such as phosphorus or arsenic is irradiated to the entire area of the semiconductor substrate 1, whereby low density n-type diffusion layers 11 are formed, using the gate part 10 as a mask (FIG. 1C).

Figure 1D:
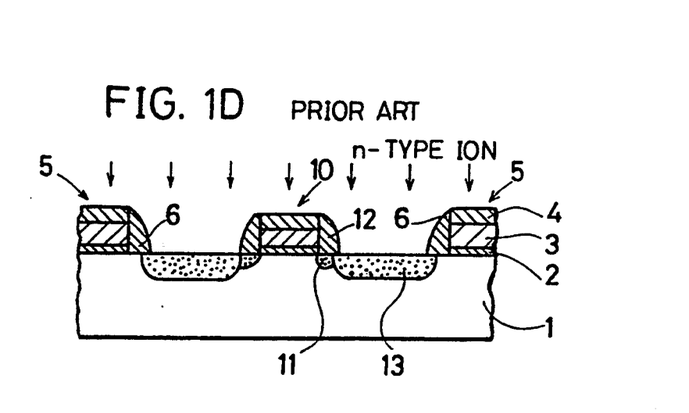

Then, a SiO$_2$ film of about 2000 Å in thickness is deposited on the entire surface of the semiconductor substrate 1, and the anisotropic etching is effected to form sidewall spacers 12 on sidewalls of the gate part 10. An n-type impurity ion such as phosphorus or arsenic is then irradiated to the entire area of the semiconductor substrate 1 to form high density n-type diffusion layers 13, using the gate part 10 and the sidewall spacers 12 as the mask (FIG. 1D).

The low density n-type diffusion layers 11 and the high density n-type diffusion layers 13 which are formed in the above processes form source/drain regions, whereby the field effect transistor of the MOS type LDD structure is formed.

However, there have been following problems in the semiconductor device and the manufacturing method thereof in the prior art stated above.

Figure 2A:
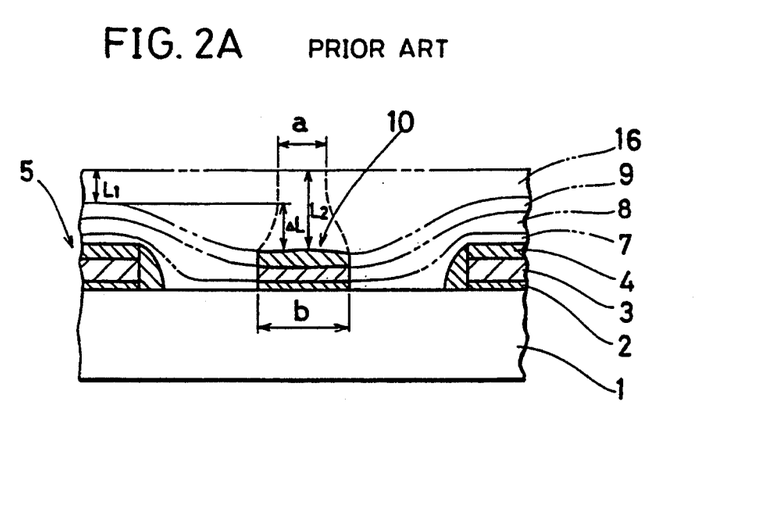
FIG. 2A is a cross section for illustrating a phenomenon of defocus in a manufacturing process of a conventional semiconductor device.

First, since there is a stepped portion or difference in level between the field shield part 5 and the surface of the semiconductor substrate in the active region, a so-called defocus may be caused in the process for forming the gate part 10. This defocus is caused by variation of a thickness of a resist film 16, which serves as a mask for forming the gate part 10 by the etching. More specifically, a portion of the resist film 16 covering an area for the gate part 10 has a thickness larger than that of the portion thereof covering the field shield part 5, so that the resist film 16 is left in a configuration indicated by dashed line in FIG. 2A in the photolithography processing. Consequently, the gate part 10 actually formed has a width b larger than a size a determined as a design value of the width of the gate part 10 by the patterning on the surface of the resist film 16.

A phenomenon of such defocus, a resolution R, a focus margin DF and a number NA of openings in an optical system for the photolithography have a following relationship.

Assuming that an irradiation light used in the photolithography has a wave length of λ, a following relational expression can be established between the resolution R, focus margin DF and opening number NA, as is already known.

$$R = 0.6\lambda/NA \qquad (1)$$

$$DF = 1.39 R^2/\lambda \qquad (2)$$

Figure 2B:
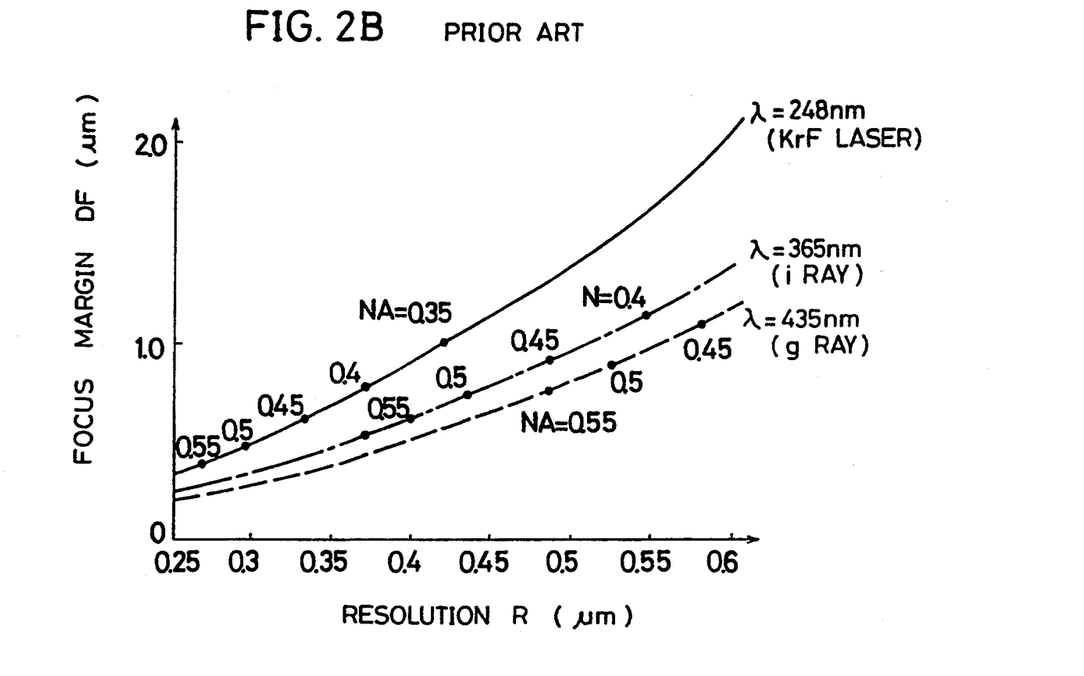
FIG. 2B is a graph illustrating a relationship between a resolution R and a focus margin DF in a photolithography of a resist film.
Figure 2C:
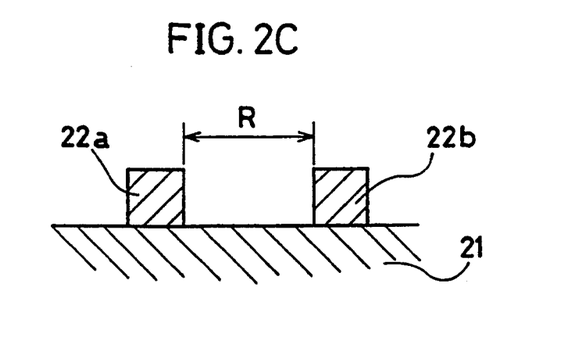
FIG. 2C is a view for illustrating a resolution R.
Figure 2D:
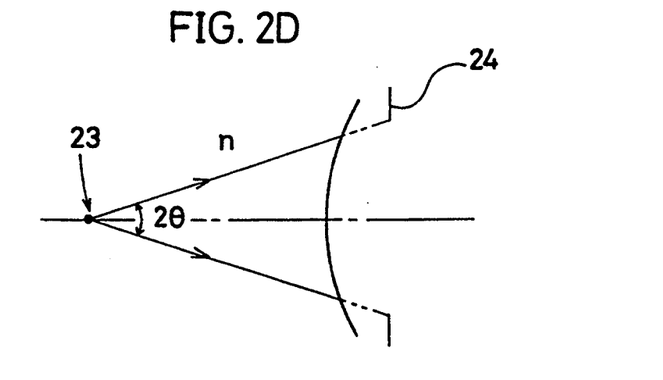
FIG. 2D is a view for illustrating an opening rate or number NA.
Figure 2E:
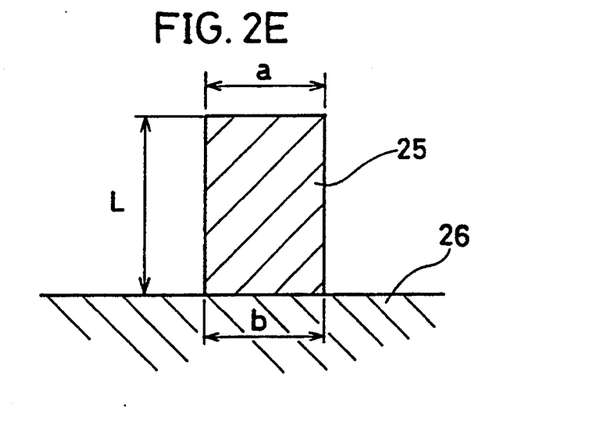
FIG. 2E is a cross section for illustrating a relationship between a sectional shape of a resist film and defocus.

FIG. 2B illustrates a graph in which the resolution R is given by the abscissa, the focus margin DF is given by the ordinate, and the variation of the opening number NA is plotted with respect to three values of λ, i.e., 248 nm (KrF laser), 365 nm (i ray) and 436 nm (g ray). As shogun in FIG. 2C, the resolution R is represented as a space between resist films 22a and 22b on a portion 21 to be etched in a unit of μm. The opening number NA is one of quantities which represent the resolution and brightness of the optical system, and is defined by a product (n sinθ) of a refractive index n of a medium and sine of a degree θ of an angle which is formed by an object point 23 on an optical axis located in the medium having the refractive index n with respect to a radius of an entrance pupil 24. The focus margin DF defines an allowable maximum length L of a resist film 25 by which the defocus is not caused, in other words, the allowable maximum length L by which the upper width a of the resist film 25 shown in FIG. 2E can be substantially equal to the width b thereof on the surface of an object 26 to be etched, and the focus margin DF represents the value by which the width a is substantially equal to the width b in a range of L/2 < DF. Even if the thickness of the resist film 16 satisfies the above inequality in the upper portion (thickness L$_1$) of the field shield part 5, said inequality is not satisfied in the upper portion (thickness L$_2$) of the gate part 10 and thus the defocus is caused, due to the difference ΔL of level shown in FIG. 2A. Further, if the difference of level ΔL is larger than the double of DF, the defocus is inevitably caused on the gate part 10.

As described above, if the defocus is caused at the element formation pattern in the active region, such a phenomenon is caused that there is a difference between the size of the exposure pattern in the photolithography of the resist film and the size of the actually formed element, and thus the element characteristics intended in the design cannot be obtained.

The second problem caused by the difference of level ΔL is that a disadvantageous phenomenon is caused by debris which remains on the sidewall of the field shield part 5 in the etching process for forming the gate part 10.

Figure 3A:
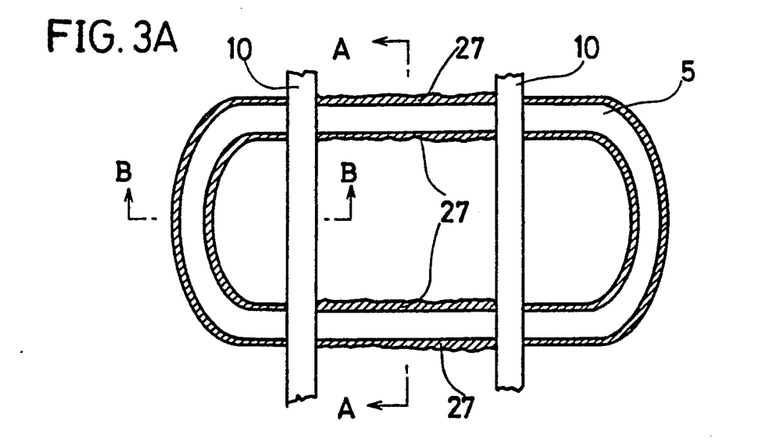
FIGS. 3A, 3B and 3C are a top view, a cross section taken along line A—A in FIG. 3A and a cross section taken along line B—B in FIG. 3A which illustrate a phenomenon of deposition of debris on a sidewall of a field shield part in manufacturing processes of a semiconductor device in the prior art.
Figure 3B:
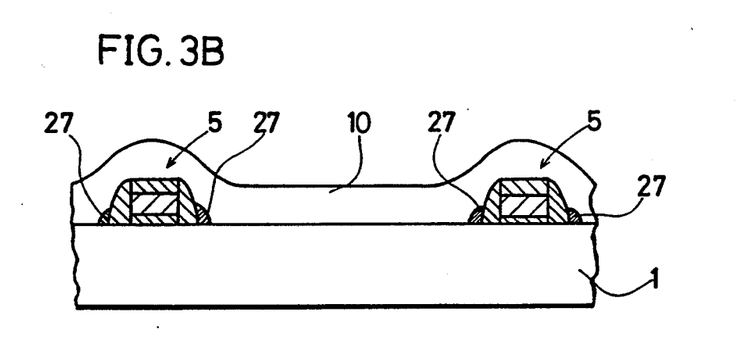
Figure 3C:
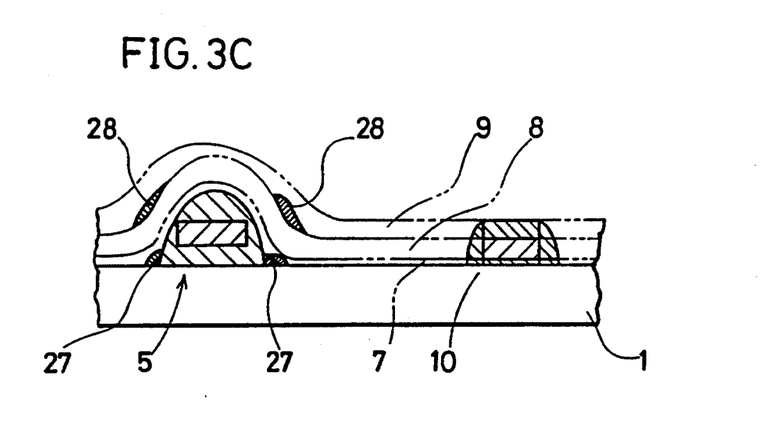

The phenomenon by the residual debris is described below with reference to FIGS. 3A–3C. If there is a difference of level ΔL, the debris 27 which is primarily formed of polysilicon is deposited on a lower part of the sidewall of the field shield part 5, which may cause the disadvantageous phenomenon such as short-circuiting between the adjacent gate parts and/or between other conductive wiring layers, as shown in FIG. 3A and FIG. 3B which is a cross section taken along line A—A in FIG. 3A.

The cause of the deposition of the debris 27 can be explained as follows with reference to FIG. 3A and FIG. 3C which is a cross section taken along line B—B in FIG. 3B. In the etching process for forming the pate part 10, the $SiO_2$ film 9 is initially etched. In this step, the steep slant or stepped portion at the vicinity of the field part 5 causes the deposition of the component(s) of the etching gas on the surface of the polysilicon layer 8, resulting in a deposition film 28. This deposition film 28 serves as a mask which prevents the progress of the etching at an area immediately below it, and thus when the gate part 10 is completed, the debris 27 primarily composed of the polysilicon sticks onto a lower portion of the sidewall of the field shield part 5.

The problems described above are caused in such a case that the active regions are separately insulated from each other by the field shield, and is also similarly caused in such a case that the element separation insulator layer is formed, for instance, by a LOCOS method.

SUMMARY OF THE INVENTION

It is an object of the invention to provide a semiconductor device which can prevent defocus in a photolithography processing for patterning a resist film, and also can prevent deposition of a debris on a lower portion of a sidewall of an element separation insulator layer during formation of an element separation structure for separately insulating an active region of a semiconductor element such as a MOS type field effect transistor, and to provide a manufacturing method of the same.

In order to achieve the above object, a semiconductor device according to the invention comprises an element separation insulator layer which is formed to surround an active region and to have a substantially uniform height throughout its periphery on a main surface of a semiconductor substrate, and separately insulates this active region from others. In the semiconductor device, the active region surrounded by this element separation insulator layer bears a flat semiconductor layer formed thereon at a height substantially same as that of the element separation insulator layer so as to eliminate a stepped portion relative to the element separation insulator layer, and a surface of the semiconductor layer is used as an element formation region.

According to this semiconductor device, since the element formation region is arranged on the flat semiconductor layer which does not form a stepped portion relative to the element separation insulator layer, a resist film for forming an element by etching can be formed at a uniform thickness, so that defocus is restricted in a photolithography processing of the resist film. Further, since there is no steep slope or slant at a boundary between the element separation insulator layer and the element formation region, a disadvantageous phenomenon, which may be caused by the deposition of the debris in the etching process, can be prevented.

According to a manufacturing method of a semiconductor device of the invention, an element separation insulator layer, which surrounds an active region to separately insulate it from others, is selectively patterned and formed on a predetermined position on a main surface of a semiconductor substrate. A semiconductor layer is then formed on an entire area of a main surface of the semiconductor substrate. Thereafter, a resist film is applied substantially flat on an entire surface of the semiconductor layer. The semiconductor layer and the resist film are then etched at a substantially equal selection ratio so as to expose the element separation insulator layer throughout a periphery thereof and to flatten the semiconductor layer at a height by which a stepped portion is not formed relative to the element separation insulator layer. Thereafter, an element is formed in the surface of the semiconductor layer.

In a manufacturing method of another aspect of the invention, after selectively forming an element separation insulator layer by patterning, the element separation insulator layer is covered with a resist film, and then, a semiconductor layer is selectively formed only at an active region separately insulated by the element separation insulator layer so as to have a height substantially same as that of the element separation insulator layer. Then, an element is formed in a surface of the semiconductor layer after removing the resist film.

According to these manufacturing methods of the semiconductor device, the flat semiconductor layer can be facilely formed without a stepped portion relative to an element separation insulator layer.

As described above, according to the semiconductor device and the manufacturing method of the same of the invention, since there is no stepped portion between the element separation insulator layer and the surface of the active region in which an element is formed, the invention can prevent a defocus phenomenon during a photolithography processing of the resist for forming the element as well as such a disadvantageous phenomenon that a debris sticks onto the sidewall of the element separation insulator layer in the etching process. Thereby, the invention can remarkably reduce an error or difference between a design size of the element pattern and an actual size of the element, and also can prevent a disadvantageous phenomenon such as short-circuiting between conductive wirings by the debris.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A, 6B and 6C are views for illustrating an effect by an embodiment of the invention, wherein

DESCRIPTION OF THE PREFERRED EMBODIMENTS

Embodiments of the invention will now be described with reference to figures.

Figure 4:
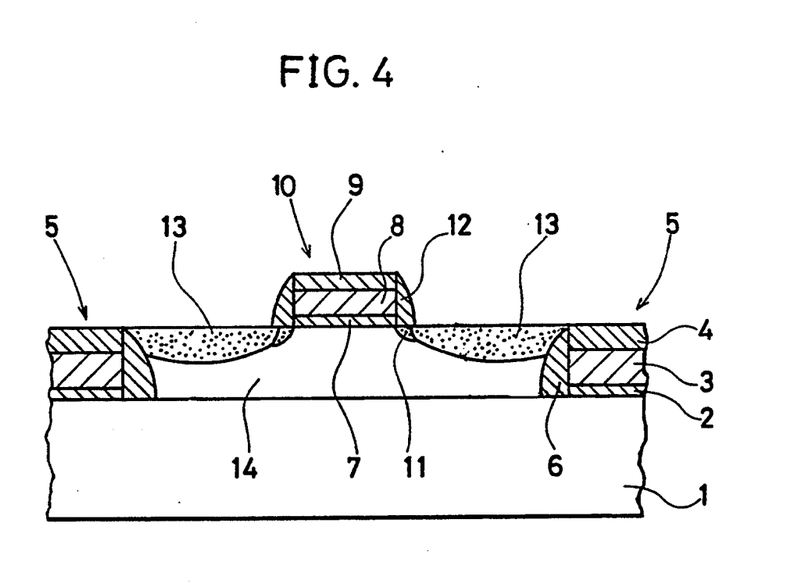
FIG. 4 is a cross section illustrating structures of a semiconductor device according to an embodiment of the invention.

FIG. 4 schematically illustrates sectional structures of a semiconductor device manufactured in an embodiment of the invention. The semiconductor device illustrated in FIG. 4 comprises a p-type semiconductor substrate 1 on which a field shield part 5 is formed by a $SiO_2$ film 2, polysilicon layer 3 doped with an impurity and a $SiO_2$ film 4. A sidewall spacer 6 is formed on a side wall of this field shield part 5. The field shield part 5 and the side wall spacer 6 form an element separation insulator layer which surrounds and separately insulates an active region for forming an element from other active regions.

On an area of a surface of the semiconductor substrate 1 surrounded by this element separation insulator layer, there is formed a flat silicon epitaxial film 14 as a semiconductor layer at a height substantially equal to that of the field shield part 5 so as to be essentially coplanar with it, as shown in FIG. 4. The semiconductor epitaxial film 14 is provided at its surface with a gate part 10 formed of a $SiO_2$ film 7, a polysilicon layer 8 doped with an impurity and a $SiO_2$ film 9, and is also provided at sidewalls with sidewall spacers 12. Low density n-type diffusion layers 11 and high density n-type diffusion layers 13, which form source/drain regions of a MOS type LDD structure, are formed at an area below and outside the sidewalls of the gate part 10.

Figure 5A:
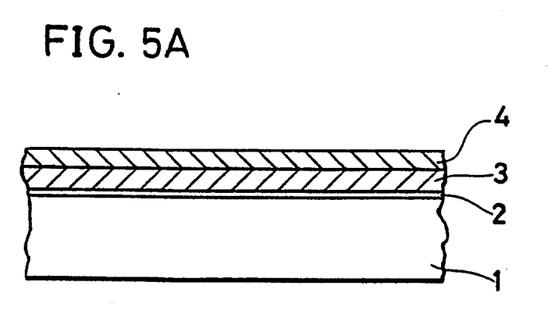
FIGS. 5A, 5B, 5C, 5D, 5E and 5F are cross sections sequentially illustrating manufacturing processes of a semiconductor device according to an embodiment of the invention.

The transistor of the MOS type LDD structure thus formed is manufactured as described below. In the manufacturing method of this embodiment, a $SiO_2$ film 2 of about 200 Å in thickness is initially formed, e.g., by a thermal oxidation method on an entire area of the p-type semiconductor substrate 1 and the polysilicon layer 3 of about 2000 Å in thickness is then formed thereon, e.g., by a vacuum CVD method. The $SiO_2$ film 4 of about 2000 Å in thickness is further deposited on an entire area of the polysilicon layer 3, e.g., by a CVD method (FIG. 5A).

Figure 5B:
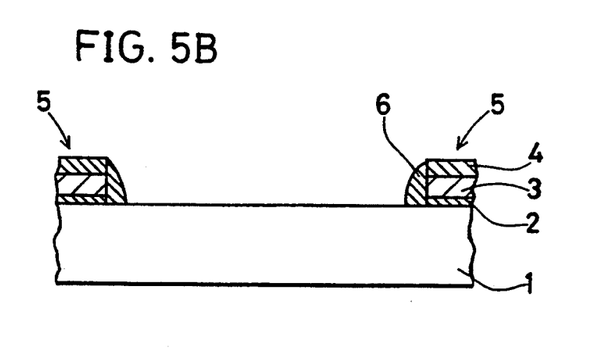

Then, photolithography and etching are utilized to sequentially and selectively etch the $SiO_2$ film 4, the polysilicon layer 3 and the $SiO_2$ film 2 to form the field shield part 5. Thereafter, a $SiO_2$ film of about 2000 Å in thickness is deposited on an entire surface of the semiconductor substrate 1 by the CVD method or the like, and then the sidewall spacer 6 is formed on the sidewall of the field shield part 5 by anisotropic etching. Simultaneously, the surface of the semiconductor substrate 1 except for an area provided with the field shield part 5 is exposed (FIG. 5B).

The processes described above are same as those in the conventional manufacturing method described before.

In this embodiment, a silicon epitaxial film 14 is formed at an active region on the surface of the semiconductor substrate 1 surrounded by the field shield part 5. A vapor phase epitaxy (VPE) which is a type of CVD method is utilized for the formation of this silicon epitaxial film 14. In the formation of silicon monocrystal by the VPE, the semiconductor substrate 1 formed of the silicon monocrystal is initially heated to a temperature of about 1200° C. and polishing (vapor etching) is effected on the surface thereof by HCl gas. Then, material gases, i.e., $SiCl_4$ and $H_2$, are introduced into a reactor tube. Silicon is deposited by a following reaction:

$$SiCl_4 + 2H_2 \rightleftharpoons Si + 4HCl$$

This reaction is a chemical reaction, in which the silicon monocrystal is epitaxially grown when factors such as a density ratio of $SiCl_4$ and $H_2$ satisfy appropriate conditions.

If it is necessary to dope the silicon epitaxial film 14 with an impurity, it is required only to introduce $PH_3$ (for n-type) or $B_2H_6$ (for p-type) into the reactor tube.

Figure 5C:
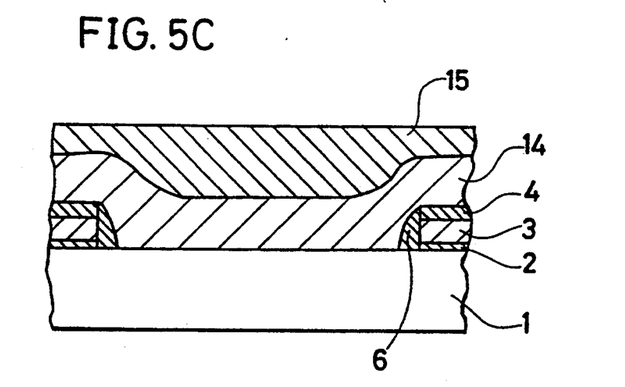

After the formation of the silicon epitaxial film 14, a resist film 15 is applied on an entire surface thereof. When applying the resist film 15, the semiconductor substrate 1 is spun at a high speed, e.g., by a spinner so as to form a flat surface. FIG. 5C illustrates a condition in which the flat resist film has been formed on the silicon epitaxial film 14.

Figure 5D:
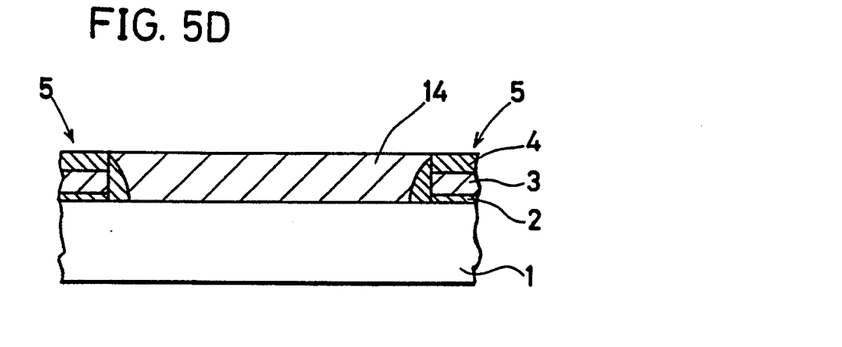

Then, etching is effected to obtain a condition shown in FIG. 5D entirely on the semiconductor substrate 1, in which the surface of the silicon epitaxial film 14 and a top of the field shield part 5 are flat and form a substantially common plane. This etching process is effected under conditions in which the silicon epitaxial film 14 and the resist film 15 are etched at a same selection ratio. The etching of the silicon epitaxial film 14 and the resist film 15 at the same selection ratio may be effected by determining an electric field for accelerating an ion at a low vacuum to a predetermined value or more in a case of sputtering etching with an etching gas such as $CF_4$. The active region also can be flattened by using the resist film 15 of material having an etching rate same as that of the silicon epitaxial film 14.

Figure 5E:
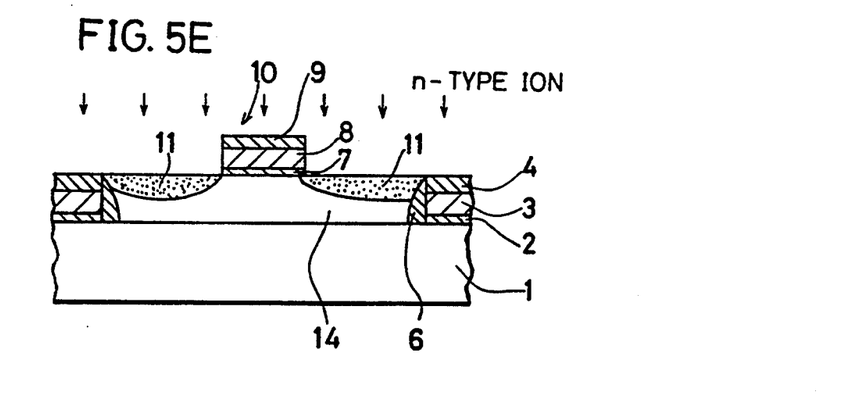

Then, after $SiO_2$ film 7 of about 200 Å in thickness is formed by a thermal oxidation method on the silicon epitaxial film 14, and the polysilicon layer 8 doped with the impurity is further deposited thereon to have a thickness of about 2000 Å, e.g., by the CVD method. The $SiO_2$ film 9 of about 2000 Å in thickness is further formed thereon, and the $SiO_2$ film 9, polysilicon layer 8 and $SiO_2$ film 7 are sequentially and selectively removed by the photolithography and the etching to form the gate part 10. Then, an n-type impurity ion such as phosphorus or arsenic is irradiated to the entire surface of the semiconductor substrate 1, and the low density n-type diffusion layers 11 which form the source/drain regions of the transistor are formed, using the gate part 10 as the mask (FIG. 5E).

Figure 5F:
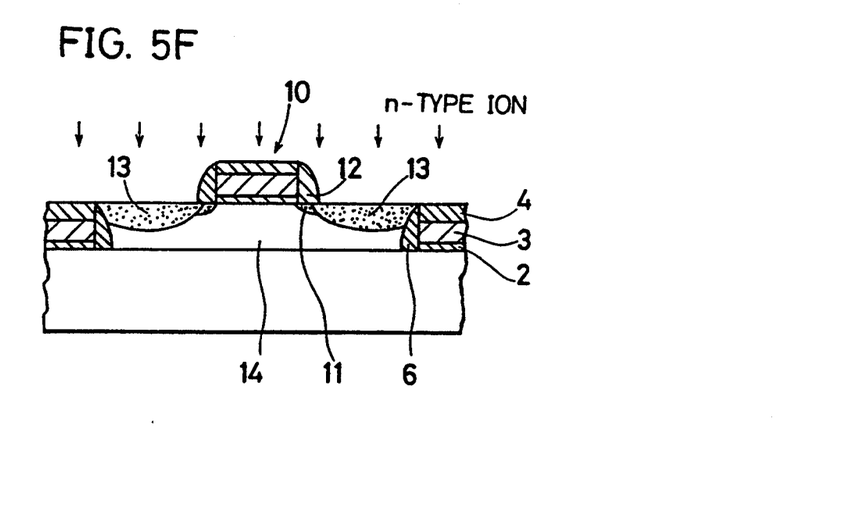

Then, the $SiO_2$ film is deposited at a thickness of about 2000 Å on the entire surface of the semiconductor substrate 1, and the anisotropic etching is effected thereon to form the side wall spacers 12 on the sidewalls of the gate part 10. Thereafter, the n-type impurity ion such as phosphorus or arsenic is irradiated to the entire surface of the semiconductor substrate 1, and the high density n-type diffusion layers 13 are formed, using the gate part 10 and the sidewall spacers 12 as the mask (FIG. 5F).

The MOS type LDD structure field effect transistor of the embodiment, which is manufacture by the above described processes, has following advantages.

Figure 6A:
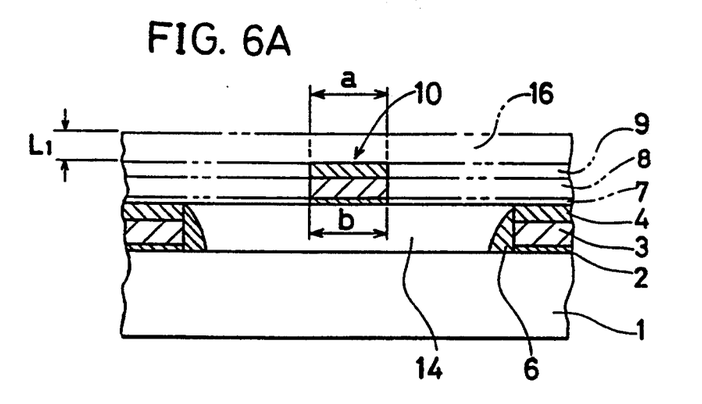
FIG. 6A is a cross section illustrating a transverse section of a gate part 10 of a semiconductor device of an embodiment.

First, the defocus can be prevented in the photolithography process for patterning the mask 16 which is used to form the gate part 10 in the etching process. That is, as shown in FIG. 6A, since the resist film 16 can be uniformly applied at such a thickness that the condition of $L_1/2 < DF$ is maintained, the width a of the exposure pattern on the surface of the resist film 16 can be equal to the width b of the actually formed gate part 10. Thus, the design size of the exposure pattern can be coincide with the actual size of the element formed on the surface of the active region, and thus the intended element characteristics can be obtained.

Figure 6B:
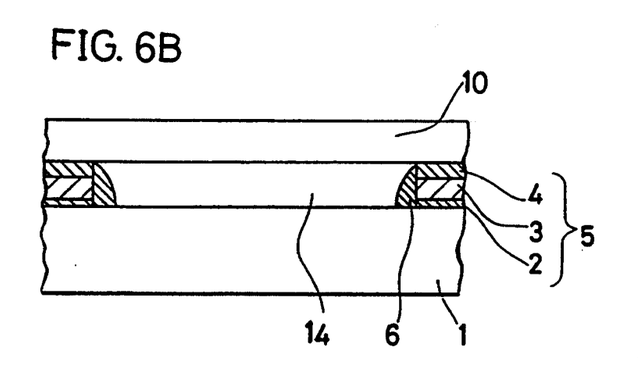
FIG. 6B is a cross section taken along a vertical sectional plane located substantially parallel to and outside the pate part 10.

A section of the embodiment, which corresponds to that in the prior art shown in FIG. 3B, has a configuration shown in FIG. 6B in which the gate part 10 is formed on a flat surface even at the vicinity of the field shield part 5. Therefore, there is no steep slant, and thus deposition of the debris 27 shown in FIG. 3C is not caused in the etching process for forming the gate part 10. Consequently, disadvantages such as short-circuiting between the gate parts and/or conductive wirings by the debris can be prevented.

Figure 6C:
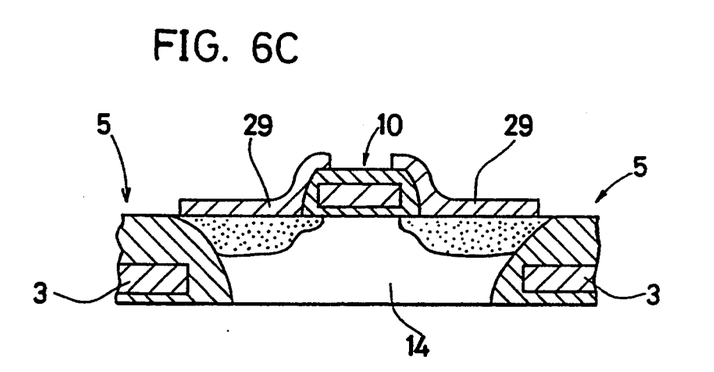
FIG. 6C is a cross section for illustrating a case in which a pad 39 is formed in an active region.

Owing to existence of the epitaxial film 14, a space is maintained, as shown in FIG. 6C, between pads 39 for the conductive wirings formed on the surface of the active region and the field electrodes 3 in the field shield part 5, and thus the insulating characteristics between them can be improved.

Figure 7A:
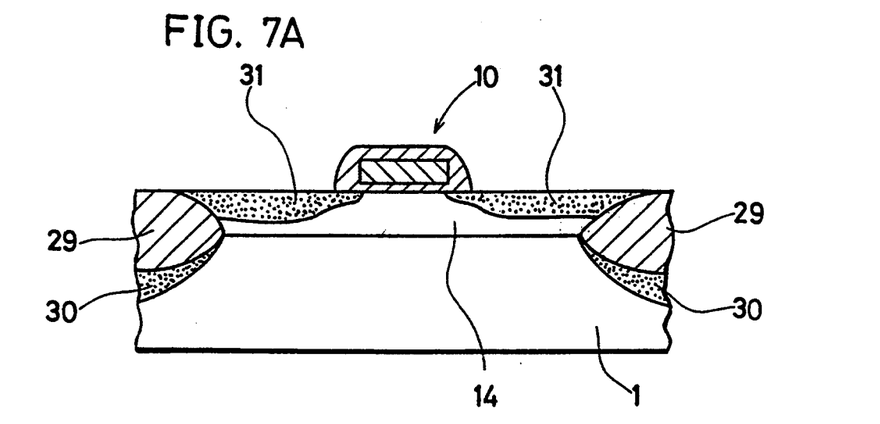
FIG. 7A is a cross section of a semiconductor device in which the invention is applied so as to separately insulate an active region by an element separation insulator layer 29 formed by a LOCOS method.

The above embodiment has been described with reference to such a form in which separating and insulating of the active region is effected by applying a bias voltage to the field shield electrode of the field shield part. However, the application of the invention is not restricted to this. The invention may be applied to such a form that, for instance, a so-called LOCOS method is employed, as shown in FIG. 7A, to form an element separation insulator layer 29 so as to effect the separation and insulation of the element. In this case, the defocus and deposition of the debris can be prevented, as is done in the previously described embodiment. Further, when the separation of the active region is effected by the element separation insulator layer 29, the silicon epitaxial layer 14 is interposed between so-called p+ isolations 30 and source/drain regions 31 which are formed under the element separation insulator layer 29 by doping with the p-type impurity ion, which ensures the insulation therebetween, and thus can reduce a leak current.

Figure 7B:
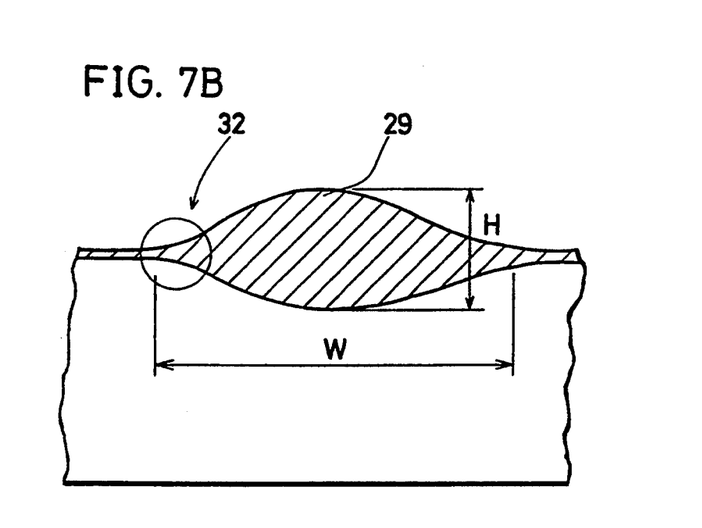
FIG. 7B is an enlarged cross section of the element separation insulator layer 29.

Since the thickness of the element separation insulator layer 29 formed by the LOCOS method varies smoothly, there is such an advantage that breaking of wires is not cause when forming aluminum wirings thereon. However, it is difficult to fully control a shape of a so-called bird's beak 32 (FIG. 7B) which is a peripheral portion of the separation region extended toward the active region. Thus, a ratio W/H of the width W and the height H of the element separation insulator layer 29 is larger than that in the case of the field shield, resulting in difficulty in increasing the degree of integration. Accordingly, application of the field shield is essential in order to improve the degree of integration. Further, a problem relating to the stepped portion between the element separation insulator layer and the active region has been remarkably caused in the separation and insulation by the field shield, as compared with the case by the LOCOS method, and thus it can be understood that the present invention can be applied more effectively to the case of the field shield.

Although the VPE is utilized to form the silicon epitaxial layer 14 in the embodiment described above, other epitaxial growth methods such as MBE (molecular beam epitaxy) may be employed for the growth thereof. This MBE is a technique in which material substance and impurity are evaporated in the vacuum from independent evaporation sources under the precise control of the temperatures, respectively, so that a thin film in a monocrystal state is epitaxially grown on the substrate. This epitaxial growth by the MBE is particularly useful when GaAs having a high speed characteristic is used as the semiconductor substrate.

Figure 8A:
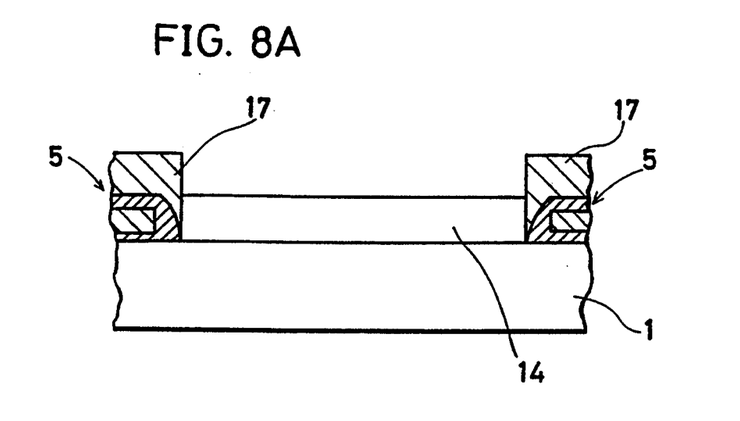
FIGS. 8A, 8B and 8C are views sequentially illustrating processes for forming a silicon epitaxial layer 14 by a selective epitaxial growth method which is another embodiment of the invention.
Figure 8B:
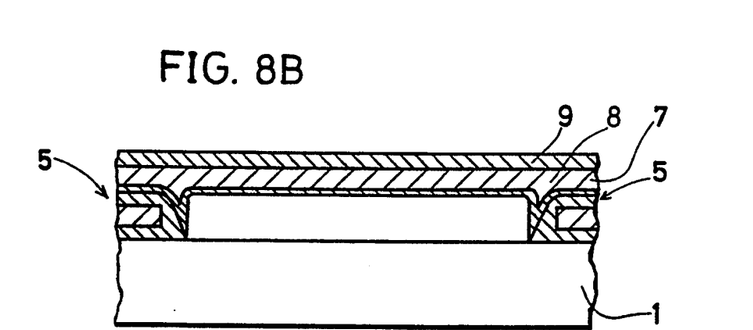
Figure 8C:
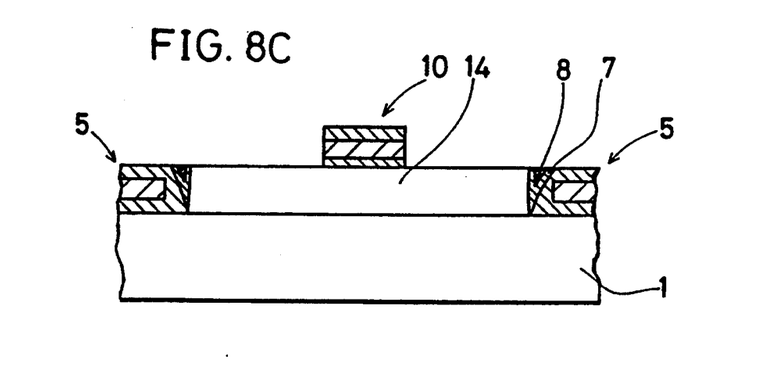

Further, in the above embodiments, the silicon epitaxial layer 14 is initially deposited on the entire surface of the semiconductor substrate 1, the resist film 15 is then applied flat and they are etched at the same selection ratio for flattening. However, as shown in FIGS. 8A-8C, the silicon epitaxial layer 14 can be selectively and epitaxially grown at the active region. In this method, a resist film 17 is used to cover an area at which the silicon epitaxial film 14 is not to be grown, and the silicon epitaxial film 14 is formed flat to maintain a same level or height as the field shield part 5 (FIG. 8A). After the removal of the resist film 17, the $SiO_2$ film 7, the polysilicon layer 8 doped with the impurity and the $SiO_2$ film 9 are sequentially deposited on the whole surface of the semiconductor substrate 1 (FIG. 8B), and then the gate part 10 is formed by the photolithography and etching (FIG. 8C). This selective epitaxial growth method enables the elimination of the etching process for flattening the silicon epitaxial layer 14. However, as shown in FIG. 8C, the SiO2 film 7 and the polysilicon layer 8 which are used for forming the gate portion 10 remain on the sidewall of the field shield part 5. Therefore, a disadvantageous phenomenon such as short-circuiting between the conductive wirings by the polysilicon layer 8 may be caused. Accordingly, it can be understood that employment of the flattening process for the formation of the silicon epitaxial layer 14 is preferable, as is done in the embodiments described above, rather than the selective epitaxial growth method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device comprising the steps of:
   selectively forming an element separation insulator layer, which surrounds an active region and insulates said active region from other active regions, at a predetermined position on a main surface of a semiconductor substrate;
   forming a semiconductor layer on an entire area of a main surface of said semiconductor substrate after said formation of said element separation insulator layer;
   applying a resist film substantially flat on an entire main surface of said semiconductor layer;
   etching said semiconductor layer and said resist film at a substantially equal selection ratio so as to expose said element separation insulator layer throughout a periphery thereof and to flatten a main surface of said semiconductor layer at a height by which a stepped portion is not formed relative to said element separation insulator layer; and
   forming an element on said flattened main surface of said semiconductor layer;
   wherein said step for selectively forming said element separation insulator layer includes the steps of:
   (i) forming a polysilicon layer on said main surface of said semiconductor substrate with a first silicon oxide film therebetween,
   (ii) depositing a second silicon oxide film on said polysilicon layer,
   (iii) sequentially and selectively etching said second silicon oxide film, said polysilicon layer and said first silicon oxide film by means of photolithography to form a field shield part, and
   (iv) forming a sidewall spacer on a side wall of said field shield part by deposition of a third silicon oxide film and anisotropic etching applied thereon; and
   wherein said step of forming said element on said flattened main surface of said semiconductor layer includes the steps of:
   (i) forming a gate part on a portion of said flattened main surface of said semiconductor layer, and
   (ii) forming a source/drain region by injecting an impurity ion of a conductive type opposite to that of said semiconductor layer, wherein said injecting includes ion implantation above an inclined surface of said sidewall spacer such that said source/drain region extends to said inclined surface of said sidewall spacer.

2. A manufacturing method of a semiconductor device according to claim 1, wherein said step of forming said semiconductor layer is effected by forming a silicon epitaxial film by a vapor phase epitaxy.

3. A manufacturing method of a semiconductor device according to claim 1, wherein GaAs is used as said semiconductor substrate, and said step of forming said semiconductor layer is effected by a molecular epitaxy growth.

4. A manufacturing method of a semiconductor device according to claim 2, wherein said step of forming said silicon epitaxial film comprises the steps of:
   heating said semiconductor substrate to a temperature of about 1200° C.;
   effecting vapor etching on said main surface of said semiconductor substrate with a HCl gas; and
   introducing SiCl4 and H2 and depositing silicon on said main surface of said semiconductor substrate.

5. A manufacturing method of a semiconductor device according to claim 1, wherein said step of applying said resist film is effected while spinning said semiconductor substrate at a high speed by a spinner.

6. A manufacturing method of a semiconductor device according to claim 1, wherein said step of forming said element on said flattened main surface of said semiconductor layer includes the steps of:
   forming a second sidewall spacer on a side wall of said gate part; and
   selectively using said gate part and said second sidewall spacer as a mask.

7. A manufacturing method of a semiconductor device comprising the steps of:
   selectively forming an element separation insulator layer, which surrounds an active region and insulates said active region from other active regions, at a predetermined position on a main surface of a semiconductor substrate;
   forming a semiconductor layer on an entire area of a main surface of said semiconductor substrate after said formation of said element separation insulator layer;
   applying a resist film substantially flat on an entire main surface of said semiconductor layer;
   etching said semiconductor layer and said resist film at a substantially equal selection ratio so as to expose said element separation insulator layer throughout a periphery thereof and to flatten a main surface of said semiconductor layer at a height by which a stepped portion is not formed relative to said element separation insulator layer; and
   forming an element on said flattened main surface of said semiconductor layer;
   wherein said step of selectively forming said element separation insulator layer is effected by a LOCOS method and includes forming a bird's beak portion of said element separation insulator layer extending towards said active region; and
   wherein said step of forming said element on said flattened main surface of said semiconductor layer includes the steps of:
   (i) forming a gate part on a portion of said flattened main surface of said semiconductor layer, and (ii) forming a source/drain region by injecting an impurity ion of a conductive type opposite to that of said semiconductor layer, wherein said injecting includes ion implantation above an inclined surface of said bird beaks portion such that said source/drain region extends to said inclined surface of said bird's beak portion.

8. A manufacturing method of a semiconductor device according to claim 7, wherein said step of forming said semiconductor layer is effected by forming a silicon epitaxial film by a vapor phase epitaxy.

9. A manufacturing method of a semiconductor device according to claim 7, wherein GaAs is used as said semiconductor substrate, and said step of forming said semiconductor layer is effected by a molecular epitaxy growth.

10. A manufacturing method of a semiconductor device according to claim 7, wherein said step of forming said silicon epitaxial film comprises the steps of:

heating said semiconductor substrate to a temperature of about 1200° C.;

effecting vapor etching on said main surface of said semiconductor substrate with a HCl gas; and introducing $SiCl_4$ and $H_2$ and depositing silicon on said main surface of said semiconductor substrate.

11. A manufacturing method of a semiconductor device according to claim 7, wherein said step of applying said resist film is effected while spinning said semiconductor substrate at a high speed by a spinner.

12. A manufacturing method of a semiconductor device according to claim 7, wherein said step of forming said element on said flattened main surface of said semiconductor layer includes the steps of:

forming a sidewall spacer on a side wall of said gate part; and selectively using said gate part and said sidewall spacer as mask.

* * * * *